(12) United States Patent
Wang et al.

(10) Patent No.: US 10,042,024 B2
(45) Date of Patent: Aug. 7, 2018

(54) MAGNETIC RESONANCE IMAGING METHOD AND APPARATUS

(71) Applicant: Siemens Aktiengesellschaft, Munich (DE)

(72) Inventors: Yu Yu Wang, Shenzhen (CN); Cong Zhao, Shenzhen (CN)

(73) Assignee: Siemens Aktiengesellschaft, Munich (DE)

( * ) Notice: Subject to any disclaimer, the term of this patent is extended or adjusted under 35 U.S.C. 154(b) by 663 days.

(21) Appl. No.: 14/587,069

(22) Filed: Dec. 31, 2014

(65) Prior Publication Data

US 2015/0185304 A1    Jul. 2, 2015

(30) Foreign Application Priority Data

Dec. 31, 2013 (CN) .......................... 2013 1 0753743

(51) Int. Cl.
*G01V 3/00* (2006.01)
*G01R 33/48* (2006.01)

(52) U.S. Cl.
CPC .............................. *G01R 33/4828* (2013.01)

(58) Field of Classification Search
USPC ........................................................ 324/309
See application file for complete search history.

(56) References Cited

U.S. PATENT DOCUMENTS

| | | | | |
|---|---|---|---|---|
| 6,091,243 A | * | 7/2000 | Xiang | G01R 33/4828 324/307 |
| 7,924,003 B2 | | 4/2011 | Yu et al. | |
| 8,373,415 B2 | * | 2/2013 | Reeder | G01R 33/4828 324/307 |
| 2005/0165296 A1 | * | 7/2005 | Ma | G01R 33/4828 600/410 |
| 2006/0241381 A1 | | 10/2006 | Wang et al. | |
| 2007/0098298 A1 | * | 5/2007 | Xiang | G01R 33/4828 382/276 |
| 2009/0201021 A1 | * | 8/2009 | Jellus | G01R 33/4828 324/309 |
| 2010/0195885 A1 | * | 8/2010 | Ma | G01R 33/4828 382/131 |
| 2010/0303320 A1 | * | 12/2010 | Roemer | A61B 5/055 382/131 |
| 2014/0043022 A1 | * | 2/2014 | Geerts-Ossevoort | G01R 33/4828 324/306 |
| 2014/0167755 A1 | * | 6/2014 | Nickel | G01R 33/4828 324/309 |
| 2015/0161784 A1 | * | 6/2015 | Ma | G06K 9/6215 382/131 |
| 2015/0316631 A1 | * | 11/2015 | Ma | G01R 33/5602 324/309 |

(Continued)

*Primary Examiner* — Rodney Fuller
(74) *Attorney, Agent, or Firm* — Schiff Hardin LLP

(57) ABSTRACT

In an MRI method and apparatus a scan sequence is performed to obtain a positive-phase image and an opposed-phase image. Magnetic field errors in the positive-phase image and the opposed-phase image are corrected. On the basis of multiple fat peaks of the spectrum of a magnetic resonance image signal, using the positive-phase image and the opposed-phase image to reconstruct a water image and a fat image. Artifacts caused by chemical shift can be reduced by using multiple fat peaks in the spectrum of a magnetic resonance image signal to reconstruct a water image and a fat image.

16 Claims, 3 Drawing Sheets

(56) References Cited

U.S. PATENT DOCUMENTS

2016/0169995 A1\* 6/2016 Nickel ............... G01R 33/4828
 324/309
2017/0097400 A1\* 4/2017 Nakai .................... A61B 5/055

\* cited by examiner

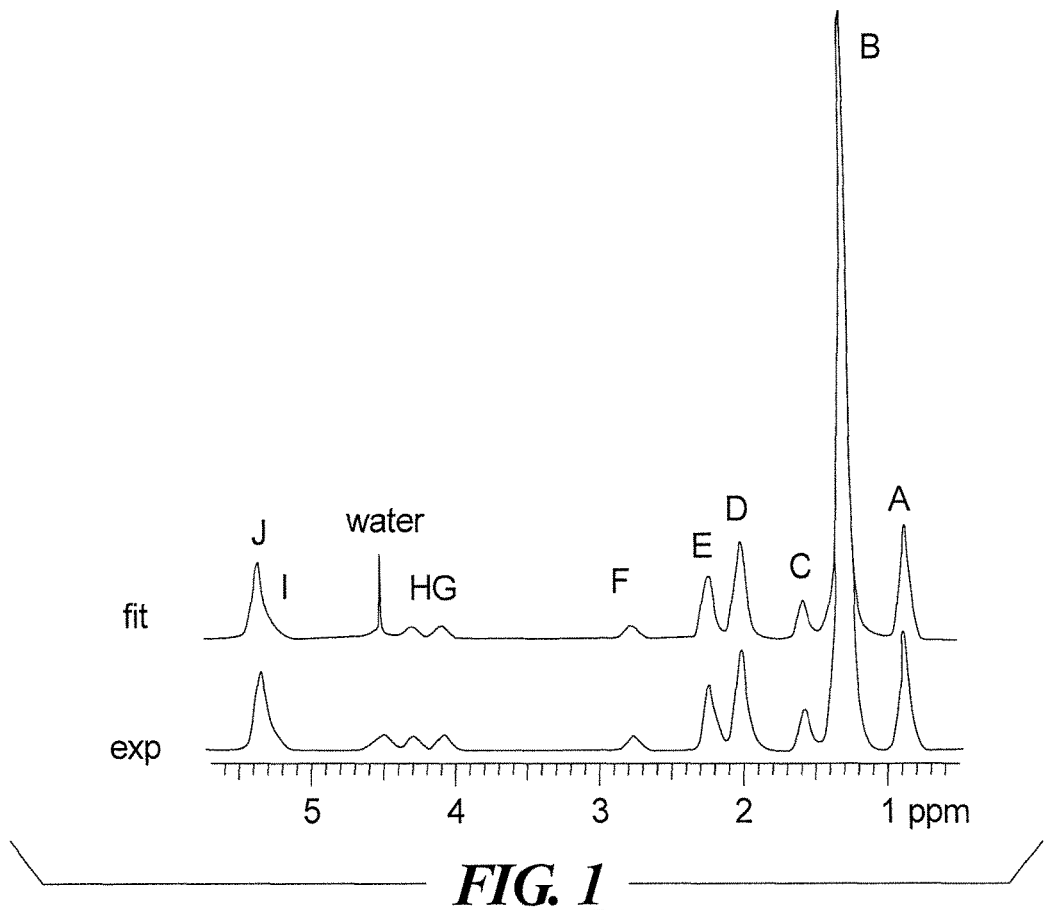
FIG. 1
FIG. 2
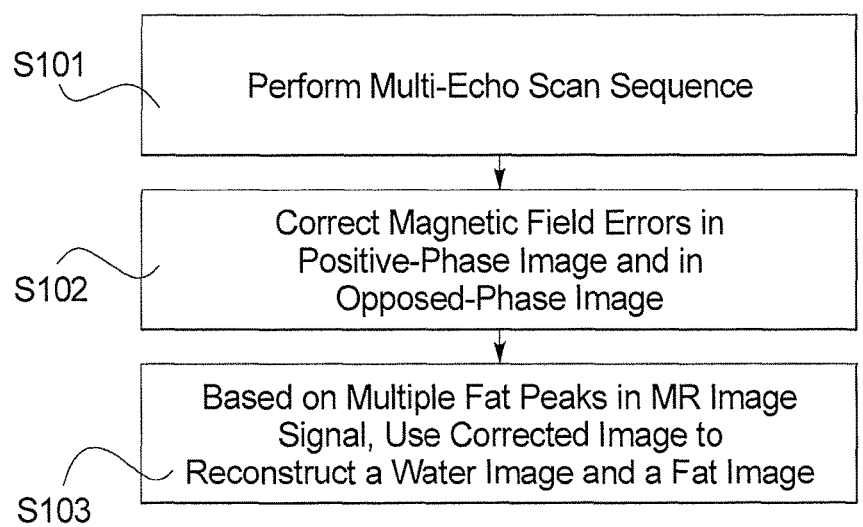

MAGNETIC RESONANCE IMAGING METHOD AND APPARATUS

BACKGROUND OF THE INVENTION

Field of the Invention

The present invention relates to a magnetic resonance imaging (MRI) method and apparatus, in particular to an MRI method and apparatus making use of the Dixon technique.

Description of the Prior Art

MRI is an imaging technology involving biomagnetics and nuclear spin which has advanced rapidly with the development of computer technology, electronic circuit technology and superconductor technology. In MRI, human body tissue is placed in a static magnetic field $B_0$, then an RF pulse of a frequency identical to the precession frequency of hydrogen nuclei is used to excite hydrogen nuclei in the human body tissue, resulting in resonance of hydrogen nuclei and absorption of energy. Once the RF pulse is stopped, the hydrogen nuclei emit radio signals at a specific frequency, releasing the absorbed energy; these are received by a receiver outside the body, and processed in a computer to obtain an image.

In MRI, to achieve better imaging quality, it is often necessary to suppress specific spectrum component signals, such as fat signals, water signals and silicone signals (from breast implants). For instance, in MRI examinations of the abdomen and chest, etc., it is generally necessary to suppress fat signals, in order to make tissues of interest or the focus of infection more prominent in the displayed image. Many fat suppression techniques have already been proposed, e.g. the CHESS (CHEmical Shift Suppression, chemical shift selective) technique, the FatSat (fat saturation) technique, the SPAIR (Spectral Presaturation Attenuated Inversion Recovery) technique, the STIR (short inversion time inversion recovery) technique and the Dixon technique, etc.

In cases where the CHESS technique fails to be effective, the Dixon technique is a widely accepted failsafe method. Compared with the CHESS technique, a water image obtained by the Dixon technique has more residual signals from fat, which present a tricky technical problem in a T2 weighted image (in which the contrast between fat tissue and non-fat tissue is very low), where T2 is the transverse relaxation time.

The Dixon technique in the prior art has the following technical feature:

$$s(t) = \left(\rho_w + \rho_f \sum_{p=1}^{P} e^{j2\pi f_p t}\right) \cdot e^{j2\pi \psi t} \quad [1]$$

Specifically, formula [1] is the signal model of the Dixon technique: wherein the magnetic resonance image signal $s(t)$ comprises a fat signal $\rho_f$ and a water signal $\rho_w$. At the same time, the spectrum of the magnetic resonance image signal includes P fat signal peaks; due to chemical shift, the various peaks of the fat signal undergo modulation by their own frequency, this frequency reflecting a phase shift caused by inhomogeneity in the local magnetic field.

SUMMARY OF THE INVENTION

In view of the above, the present invention proposes an MRI method, characterized by comprising the following steps: performing a scan sequence to obtain a positive-phase image and an opposed-phase image; correcting magnetic field errors in the positive-phase image and the opposed-phase image; on the basis of multiple fat peaks of the spectrum of a magnetic resonance image signal, using the corrected positive-phase image and the corrected opposed-phase image to reconstruct a water image and a fat image.

Preferably, the scan sequence is a multi-echo scan sequence.

Preferably, the multi-echo scan sequence comprises: a multi-echo TSE sequence, a multi-echo mDixon sequence or a multi-echo vibe Dixon sequence.

Preferably, the step of using the corrected positive-phase image and the corrected opposed-phase image to reconstruct a water image and a fat image on the basis of multiple fat peaks of the spectrum of a magnetic resonance image signal comprises: using the corrected positive-phase image and the corrected opposed-phase image to reconstruct a water image and a fat image on the basis of multiple fat peaks of the spectrum of a magnetic resonance image signal by means of a first general formula and a second general formula, wherein the first general formula is:

$$\begin{pmatrix} W \\ F \end{pmatrix} = \begin{pmatrix} 1 & 1 \\ 1 & c \end{pmatrix}^{-1} \begin{pmatrix} S_{in} \\ S_{op} \end{pmatrix}$$

wherein $S_{in}$ is the corrected in-phase image, $S_{op}$ is the corrected opposed-phase image, W is the water image and F is the fat image, the second general formula is:

$$c = \sum_{n=1}^{N} \alpha_n e^{-R_n^* t_{op} + i\Delta f_n t_{op}}$$

wherein $\alpha_n$ is the proportion of the signal intensity of the multiple fat peaks accounted for by each fat peak, $\Delta f_n$ is the frequency shift, $R_n^*$ is the rate of decay, $t_{op}$ is the echo time of the opposed-phase image, and N is the number of the multiple fat peaks.

Preferably, the step of using the corrected positive-phase image and the corrected opposed-phase image to reconstruct a water image and a fat image on the basis of multiple fat peaks of the spectrum of a magnetic resonance image signal includes:

performing a Fourier transform on the corrected positive-phase image and the corrected opposed-phase image to obtain k-space data of a positive-phase image and k-space data of an opposed-phase image;

on the basis of multiple fat peaks of the spectrum of a magnetic resonance image signal, using the k-space data of the positive-phase image and the k-space data of the opposed-phase image to obtain k-space data of a water image and k-space data of a fat image;

performing an inverse Fourier transform on the k-space data of the water image and the k-space data of the fat image to obtain the water image and the fat image.

Preferably, the step of using the k-space data of the positive-phase image and the k-space data of the opposed-phase image to obtain k-space data of a water image and k-space data of a fat image on the basis of multiple fat peaks of the spectrum of a magnetic resonance image signal comprises: using the k-space data of the positive-phase image and the k-space data of the opposed-phase image to obtain k-space data of a water image and k-space data of a fat image on the basis of multiple fat peaks of the spectrum of a magnetic resonance image signal by means of a third general formula and a fourth general formula, wherein the third general formula is:

$$\begin{pmatrix} W_{kspace}(t) \\ F_{kspace}(t) \end{pmatrix} = \begin{pmatrix} 1 & 1 \\ 1 & c(t) \end{pmatrix}^{-1} \begin{pmatrix} KS_{in}(t) \\ KS_{op}(t) \end{pmatrix}$$

wherein $KS_{in}(t)$ is the k-space data of the positive-phase image, $KS_{op}(t)$ is the k-space data of the opposed-phase image, $W_{KSPACE}(t)$ is the k-space data of the water image and $F_{KSPACE}(t)$ is the k-space data of the fat image;

wherein the fourth general formula is:

$$c = \sum_{n=1}^{N} \alpha_n e^{-R_n^* t_{op} + i\Delta f_n t_{op}}$$

wherein $\alpha_n$ is the proportion of the signal intensity of the multiple fat peaks accounted for by each fat peak, $\Delta f_n$ is the frequency shift, $R^*_n$ is the rate of decay, $t_{op}$ is the echo time of the opposed-phase image, and N is the number of the multiple fat peaks.

Preferably, the scan sequence is a basic Dixon sequence.

Preferably, the step of using the corrected positive-phase image and the corrected opposed-phase image to reconstruct a water image and a fat image on the basis of multiple fat peaks of the spectrum of a magnetic resonance image signal comprises: using a fifth general formula to obtain an uncorrected water image and an uncorrected fat image, wherein the fifth general formula is:

$$\begin{pmatrix} W_{BDM} \\ F_{BDM} \end{pmatrix} = \begin{pmatrix} 0.5 & 0.5 \\ 0.5 & -0.5 \end{pmatrix} \begin{pmatrix} S_{in} \\ S_{op} \end{pmatrix}$$

wherein $W_{BDM}$ is the uncorrected water image and $F_{BDM}$ is the uncorrected fat image, using a sixth general formula to correct the uncorrected water image and the uncorrected fat image $F_{BDM}$ so as to obtain a final water image and a final fat image, wherein the sixth general formula is:

$$\begin{pmatrix} W_{BDMF} \\ F_{BDMF} \end{pmatrix} = K \begin{pmatrix} W_{BDM} \\ F_{BDM} \end{pmatrix}$$

wherein $W_{BDMF}$ is the final water image and $F_{BDMF}$ is the final fat image, $$K = \begin{pmatrix} 1 & 1 \\ 1 & c \end{pmatrix}^{-1} = \begin{pmatrix} 1 & 1 \\ 1 & -1 \end{pmatrix}$$

wherein $$c = \sum_{n=1}^{N} \alpha_n e^{-R_n^* t_{op} + i\Delta f_n t_{op}}$$

wherein $\alpha_n$ is the proportion of the signal intensity of the multiple fat peaks accounted for by each fat peak, $\Delta f_n$ is the frequency shift, $R^*_n$ is the rate of decay, $t_{op}$ is the echo time of the opposed-phase image, and N is the number of the multiple fat peaks.

The present invention also provides an MRI apparatus, having the following modules:

a scanning module, for performing a scan sequence to obtain a positive-phase image and an opposed-phase image;

a correction module, for correcting magnetic field errors in the positive-phase image and the opposed-phase image;

a reconstruction module, for using the corrected positive-phase image and the corrected opposed-phase image to reconstruct a water image and a fat image on the basis of multiple fat peaks of the spectrum of a magnetic resonance image signal.

Preferably, the scan sequence is a multi-echo scan sequence.

Preferably, the multi-echo scan sequence comprises: a multi-echo TSE sequence, a multi-echo mDixon sequence or a multi-echo vibe Dixon sequence.

Preferably, the reconstruction module is for using the corrected positive-phase image and the corrected opposed-phase image to reconstruct a water image and a fat image on the basis of multiple fat peaks of the spectrum of a magnetic resonance image signal by means of a first general formula and a second general formula, wherein the first general formula is:

$$\begin{pmatrix} W \\ F \end{pmatrix} = \begin{pmatrix} 1 & 1 \\ 1 & c \end{pmatrix}^{-1} \begin{pmatrix} S_{in} \\ S_{op} \end{pmatrix}$$

wherein $S_{in}$ the corrected in-phase image, $S_{op}$ is the corrected opposed-phase image, water image and F is the fat image, the second general formula is:

$$c = \sum_{n=1}^{N} \alpha_n e^{-R_n^* t_{op} + i\Delta f_n t_{op}}$$

wherein $\alpha_n$ is the proportion of the signal intensity of the multiple fat peaks accounted for by each fat peak, $\Delta f_n$ is the frequency shift, $R^*_n$ is the rate of decay, $t_{op}$ is the echo time of the opposed-phase image, and N is the number of the multiple fat peaks.

Preferably, the reconstruction module is for:

performing a Fourier transform on the corrected positive-phase image and the corrected opposed-phase image to obtain k-space data of a positive-phase image and k-space data of an opposed-phase image;

on the basis of multiple fat peaks of the spectrum of a magnetic resonance image signal, using the k-space data of the positive-phase image and the k-space data of the opposed-phase image to obtain k-space data of a water image and k-space data of a fat image;

performing an inverse Fourier transform on the k-space data of the water image and the k-space data of the fat image to obtain the water image and the fat image.

Preferably, the reconstruction module is for using the k-space data of the positive-phase image and the k-space data of the opposed-phase image to obtain k-space data of a water image and k-space data of a fat image on the basis of multiple fat peaks of the spectrum of a magnetic resonance image signal by means of a third general formula and a fourth general formula, wherein the third general formula is:

$$\begin{pmatrix} W_{kspace}(t) \\ F_{kspace}(t) \end{pmatrix} = \begin{pmatrix} 1 & 1 \\ 1 & c(t) \end{pmatrix}^{-1} \begin{pmatrix} KS_{in}(t) \\ KS_{op}(t) \end{pmatrix}$$

wherein $KS_{in}(t)$ is the k-space data of the positive-phase image, $KS_{op}(t)$ is the k-space data of the opposed-phase image, $W_{KSPACE}(t)$ is the k-space data of the water image and $F_{KSPACE}(t)$ is the k-space data of the fat image;
wherein the fourth general formula is:

$$c(t) = \sum_{n=1}^{N} \alpha_n e^{-R_n^* t_{op} + i\Delta f_n t_{op}}$$

wherein $\alpha_n$ is the proportion of the signal intensity of the multiple fat peaks accounted for by each fat peak, $\Delta f_n$ is the frequency shift, $R_n^*$ is the rate of decay, $t_{op}$ is the echo time of the opposed-phase image, and N is the number of the multiple fat peaks.

Preferably, the scan sequence is a basic Dixon sequence.

Preferably, the reconstruction module is for using a fifth general formula to obtain an uncorrected water image and an uncorrected fat image,
wherein the fifth general formula is:

$$\begin{pmatrix} W_{BDM} \\ F_{BDM} \end{pmatrix} = \begin{pmatrix} 0.5 & 0.5 \\ 0.5 & -0.5 \end{pmatrix} \begin{pmatrix} S_{in} \\ S_{op} \end{pmatrix}$$

wherein $W_{BDM}$ is the uncorrected water image and $F_{BDM}$ is the uncorrected fat image, using a sixth general formula to correct the uncorrected water image and the uncorrected fat image $F_{BDM}$ so as to obtain a final water image and a final fat image,
wherein the sixth general formula is:

$$\begin{pmatrix} W_{BDMF} \\ F_{BDMF} \end{pmatrix} = K \begin{pmatrix} W_{BDM} \\ F_{BDM} \end{pmatrix}$$

wherein $W_{BDMF}$ is the final water image and $F_{BDMF}$ is the final fat image, $$K = \begin{pmatrix} 1 & 1 \\ 1 & c \end{pmatrix}^{-1} = \begin{pmatrix} 1 & 1 \\ 1 & -1 \end{pmatrix}$$

wherein $$c = \sum_{n=1}^{N} \alpha_n e^{-R_n^* t_{op} + i\Delta f_n t_{op}}$$

wherein $\alpha_n$ is the proportion of the signal intensity of the multiple fat peaks accounted for by each fat peak, $\Delta f_n$ is the frequency shift, $R_n^*$ is the rate of decay, $t_{op}$ is the echo time of the opposed-phase image, and N is the number of the multiple fat peaks.

It can be seen from the above solution that artifacts caused by chemical shift can be reduced by using multiple fat peaks in the spectrum of a magnetic resonance image signal to reconstruct a water image and a fat image. Taking a multi-echo TSE sequence as an example, since the frequency shift and decay effects of the CPMG spin echo magnetic resonance pulse sequence have been compensated for in the positive-phase echo signal, the correction only affects the opposed-phase image, so a real water image and a real fat image can be reconstructed by means of a pseudoinverse operation.

BRIEF DESCRIPTION OF THE DRAWINGS

FIG. 1 is a schematic diagram of the magnetic resonance spectrum of fat tissue.

FIG. 2 is a schematic diagram of an MRI method according to a first particular embodiment of the present invention.

DESCRIPTION OF THE PREFERRED EMBODIMENTS

The present invention is described in further detail by reference to the embodiments below, to explain the object, technical solution and advantages thereof.

The substance of the MRI method according to the present invention lies in: correcting the signal model of the Dixon technique in the prior art, and applying the signal model to the Dixon technique, so as to obtain better water/fat contrast.

The Dixon technique has the following technical feature:

$$s(t) = \left( \rho_w + \rho_f \sum_{p=1}^{P} e^{j2\pi f_p t} \right) \cdot e^{j2\pi \psi t} \quad [1]$$

Specifically, formula [1] is the signal model of the Dixon technique: the magnetic resonance image signal s(t) comprises a fat signal $\rho_f$ and a water signal $\rho_w$. At the same time, the spectrum of the magnetic resonance image signal includes P fat signal peaks; due to chemical shift, the various peaks of the fat signal undergo modulation by their own frequency, this frequency reflecting a phase shift caused by inhomogeneity in the local magnetic field.

FIG. 1 is a schematic diagram of the magnetic resonance image signal spectrum of fat tissue, wherein the magnetic resonance spectrum of fat tissue includes ten fat peaks A, B, C, D, E, F, G, H, I and J, and one water peak "water", wherein different fat peaks are the magnetic resonance signals of different types of substance in the fat. As FIG. 1 shows, the empirical values "exp" are almost the same as the fit values "fit". The default water spectrum and fat spectrum used in the Dixon technique in the prior art each have only one peak, and the largest fat peak B corresponds to P=1 in formula [1]. Two echo signals are obtained using different echo times t, and the Dixon technique in the prior art can then use formula [1] to calculate a fat signal $\rho_f$ and a water signal $\rho_w$ and thereby reconstruct a fat image and a water image. Clearly, the Dixon technique in the prior art only includes the largest peak B, ignoring the other peaks A, C, D, E, F, G, H, I and J, and this leads to the fat signal being underestimated in the Dixon technique in the prior art. As a result, a large quantity of residual fat signals can be observed in a water image: the problem of low contrast between fat tissue and non-fat tissue is especially serious in T2 weighted images.

First Embodiment

Figure 5:
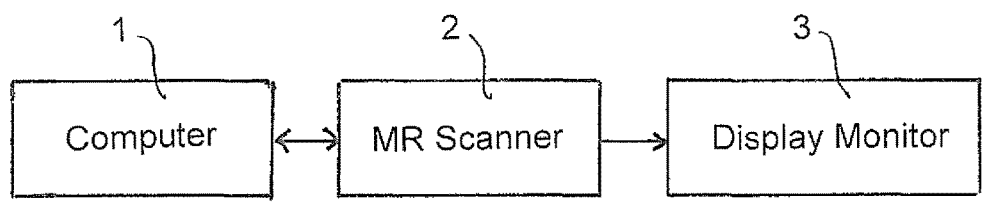
Fig. 5 is a block diagram of an MRI apparatus to implement the embodiments of the MRI method of the present invention.

FIG. 2 is a schematic diagram of an MRI method according to a first particular embodiment of the present invention. As FIG. 2 shows, the MRI method according to a first particular embodiment of the present invention comprises the following steps, with reference also to FIG. 5:

Step S101, with the computer 1, operating the MR scanner 2 as to perform a multi-echo scan sequence to obtain a positive-phase image and an opposed phase image.

The multi-echo scan sequence comprises: a multi-echo TSE sequence, a multi-echo mDixon sequence or a multi-echo vibe Dixon sequence, etc.

Step S102: in the computer 1 correcting magnetic field errors in the positive-phase image and the opposed phase image The MRI method according to a first particular embodiment of the present invention uses the method disclosed in Chinese patent application 200510009873.0 to correct magnetic field errors in the multi-echo signal; besides this, it is also possible to correct magnetic field errors in the multi-echo signal in several other ways, for example by the two-point Dixon method or the three-point Dixon method, etc. Specifically:

(1) obtaining one in-phase image and two opposed-phase images.

Let $S_0^i(x, y)$, $S_1^i(x, y)$ and $S_2^i(x, y)$ represent the in-phase image and two opposed-phase images, respectively, of channel i, where i=1 . . . n, and n is the total number of channels.

(2) finding a coil sensitivity distribution (profile) of each channel.

The solving process of this step may be split into the following steps:

(a) finding the sum of the squares of the moduli of the in-phase images of each channel, then extracting the root:

$$SOS(x, y) = \sqrt{\sum_{i=1}^{n} S_0^i(x, y)^2}$$

(b) taking a channel signal $S_0^i(x, y)$ with a relatively good signal-to-noise ratio from the in-phase images, and performing modulus normalization:

$$S_0'(x, y) = \frac{S_0^i(x, y)}{|S_0^i(x, y)|}$$

In another embodiment of the present invention, the operation of step (b) may also be: taking a linear combination of the various channel signals, and performing modulus normalization:

$$S_0'(x, y) = \frac{\sum_{i=1}^{n} S_0^i(x, y) \cdot W_i}{\left|\sum_{i=1}^{n} S_0^i(x, y) \cdot W_i\right|},$$

where $W_i$ represents weighting.

(c) calculating a coil sensitivity distribution (profile) of each channel:

$$P^i(x, y) = \frac{S_0^i(x, y) \cdot [S_0'(x, y)]^*}{SOS(x, y)},$$

where [ ]· represents taking the conjugate.

The process of finding the coil sensitivity distribution (profile) of each channel as realized in steps (a)-(c) may be replaced by other optimization algorithms, for example a corrected space matched filter method, which involves using each pixel point and neighboring point signal of each channel image to calculate a signal and noise correlation matrix, then finding the eigenvalue and eigenvector of the signal correlation matrix in order to find the sensitivity distribution of each channel coil.

(3) synthesizing the images of the various channels.

$$S_0(x, y) = \sum_{i=1}^{n} [P^i(x, y)]^* \cdot S_0^i(x, y)$$

$$S_1(x, y) = \sum_{i=1}^{n} [P^i(x, y)]^* \cdot S_1^i(x, y)$$

$$S_2(x, y) = \sum_{i=1}^{n} [P^i(x, y)]^* \cdot S_2^i(x, y)$$

In this step, the images of the various channels are synthesized to obtain a synthetic image with an optimal signal-to-noise ratio, while the image phase is retained.

(4) finding the phase difference between two opposed-phase images.

$\varphi(x, y)$=angle$[S_2(x, y) \cdot [S_1(x,y)]^*]$, where angle[ ] represents an operator for taking the phase angle.

(5) using a phase unwrapping algorithm to perform phase unwrapping on $\varphi(x, y)$, thereby obtaining a corrected phase $\varphi'(x,y)$.

Some feature regions in the in-phase image are detected to serve as criteria for phase correction.

In this step, the characteristic of the fat signal being relatively high in most of the image can be utilized to detect fat in the image, or an edge detection method can be used to detect subcutaneous fat, with these fat points being used as criteria for correcting the phase to give $\varphi'(x,y)$.

(6) correcting the phase of the opposed-phase image.

Step S103: on the basis of multiple fat peaks in the spectrum of the magnetic resonance image signal, using the positive-phase image and the opposed-phase image to reconstruct a water image and a fat image.

Specifically, each fat peak has a known resonance frequency and T2 value; and the proportion of each fat peak may be regarded as being fixed. Thus, according to step S102, $S_0^i(x, y)$, $S_1^i(x, y)$ and $S_2^i(x, y)$ represent the in-phase image and two opposed-phase images, respectively, of channel i, and if $S_0^i(x,y)$ is selected as a corrected in-phase image $S_{in}$ while any one of $S_1^i(x, y)$ and $S_2^i(x, y)$ is selected as a corrected opposed-phase image $S_{op}$, then a water image W and a fat image F are reconstructed in the computer 1 using formula [2].

$$\begin{pmatrix} W \\ F \end{pmatrix} = \begin{pmatrix} 1 & 1 \\ 1 & c \end{pmatrix}^{-1} \begin{pmatrix} S_{in} \\ S_{op} \end{pmatrix} \quad [2]$$

where c in formula [2] is found using formula [3].

$$c = \sum_{n=1}^{N} \alpha_n e^{-R_n^* t_{op} + i\Delta f_n t_{op}} \quad [3]$$

Here, $\alpha_n$ is the proportion of the signal intensity of the multiple fat peaks accounted for by each fat peak, $\Delta f_n$ is the frequency shift, $R^*_n$ is the rate of decay, $t_{op}$ is the TE time of the opposed-phase image, and N is the number of the multiple fat peaks; in the first particular embodiment according to the present invention, N is 10. These data are disclosed in "Composition of adipose tissue and marrow fat in humans by 1H NMR at 7 Tesla" J. Lipid Res. 2008. 49:2055-2062.

The reconstructed water image and fat image are shown at a display monitor 3.

Chemical shift artifacts are artifacts caused by offset in alignment between the water image and fat image. This kind of artifact arises from the fact that the water image and fat image have different resonant frequencies (since the phase of the fat signal will change in the readout stage, phase shift will occur). In the MRI method according to a first particular embodiment of the present invention, artifacts caused by chemical shift can be reduced by using multiple fat peaks in the spectrum of a magnetic resonance image signal to reconstruct a water image and a fat image. Taking a multi-echo TSE sequence as an example, since the frequency shift and decay effects of the CPMG spin echo magnetic resonance pulse sequence have been compensated for in the positive-phase echo signal, the correction only affects the opposed-phase image, so a real water image and a real fat image can be reconstructed by means of a pseudoinverse operation.

Second Embodiment

Figure 3:
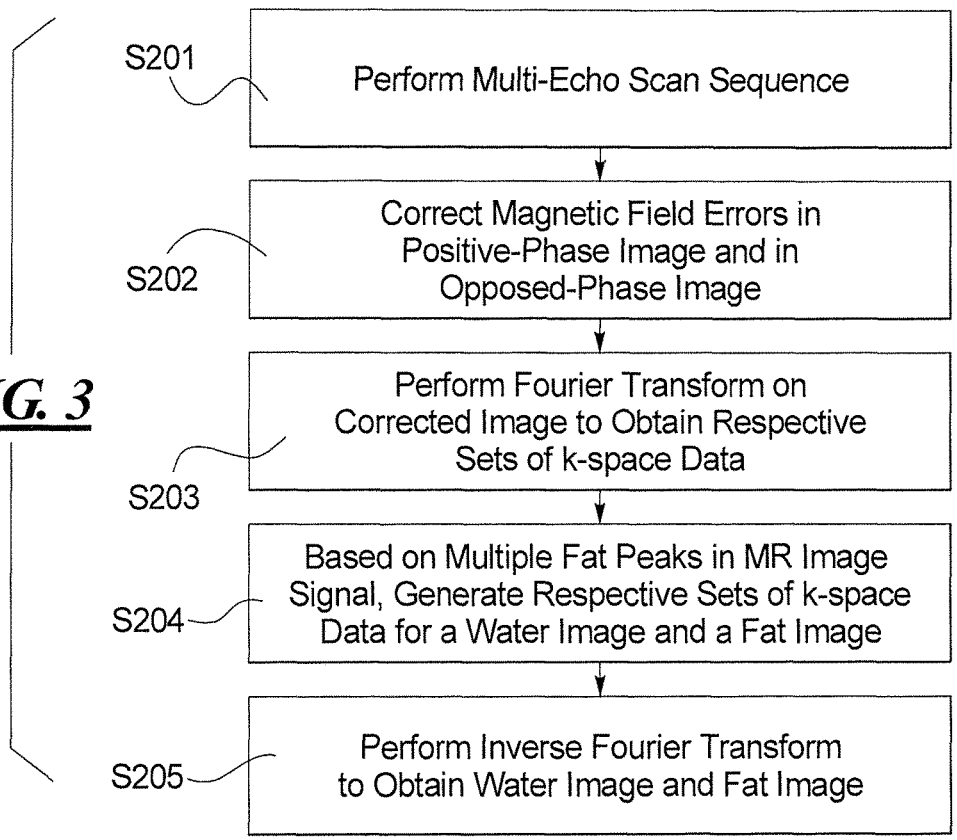
FIG. 3 is a schematic diagram of an MRI method according to a second particular embodiment of the present invention.

FIG. 3 is a schematic diagram of the MRI method according to a second particular embodiment of the present invention. As FIG. 3 shows, the MRI method according to a second particular embodiment of the present invention comprises the following steps:

Step S201: performing a multi-echo scan sequence to obtain a positive-phase image and an opposed-phase image.

The multi-echo scan sequence comprises: a two-point Dixon sequence, a multi-echo TSE sequence, a multi-echo mDixon sequence, a multi-echo vibe Dixon sequence, etc.

Step S202: correcting magnetic field errors in the positive-phase image and the opposed-phase image.

Step S203: performing a Fourier transform on the corrected positive-phase image and the corrected opposed-phase image to obtain k-space data of a positive-phase image and k-space data of an opposed-phase image.

According to step S102, $S_0^i(x, y)$, $S_1^i(x, y)$ and $S_2^i(x, y)$ represent the in-phase image and two opposed-phase images, respectively, of channel i, and if $S_0^i(x,y)$ is selected as a corrected in-phase image $S_{in}$ while any one of $S_1^i(x, y)$ and $S_2^i(x, y)$ is selected as a corrected opposed-phase image $S_{op}$, then k-space data $KS_{in}(t)$ of a positive-phase image and k-space data $KS_{op}(t)$ of an opposed-phase image are obtained by Fourier transform.

Step S204: on the basis of multiple fat peaks of the spectrum of the magnetic resonance image signal, k-space data $KS_{in}(t)$ of the positive-phase image and k-space data $KS_{op}(t)$ of the opposed-phase image are used to obtain k-space data $W_{KSPACE}(t)$ of a water image and k-space data $F_{KSPACE}(t)$ of a fat image.

Specifically, k-space data $W_{KSPACE}(t)$ of a water image and k-space data $F_{KSPACE}(t)$ of a fat image are obtained using formula [4].

$$\begin{pmatrix} W_{kspace}(t) \\ F_{kspace}(t) \end{pmatrix} = \begin{pmatrix} 1 & 1 \\ 1 & c(t) \end{pmatrix}^{-1} \begin{pmatrix} KS_{in}(t) \\ KS_{op}(t) \end{pmatrix} \quad [4]$$

wherein c(t) in formula [4] is obtained using formula [5].

$$c(t) = \sum_{n=1}^{N} \alpha_n e^{-R_n^* t_{op} + i\Delta f_n t_{op}} \quad [5]$$

Here, $\alpha_n$ is the proportion of the signal intensity of the multiple fat peaks accounted for by each fat peak, $\Delta f_n$ is the frequency shift, $R^*_n$ is the rate of decay, $t_{op}$ is the TE time of the opposed-phase image, and N is the number of the multiple fat peaks; in the second particular embodiment according to the present invention, N is 10.

Chemical shift artifacts are artifacts caused by offset in alignment between the water image and fat image. This kind of artifact arises from the fact that the water image and fat image have different resonant frequencies (since the phase of the fat signal will change in the readout stage, phase shift will occur). In the MRI method according to a second particular embodiment of the present invention, artifacts caused by chemical shift can be reduced by using multiple fat peaks in the spectrum of a magnetic resonance image signal to reconstruct a water image and a fat image.

Step S205: performing an inverse Fourier transform on the k-space data of the water image and the k-space data of the fat image to obtain the water image and the fat image.

Third Embodiment

Figure 4:
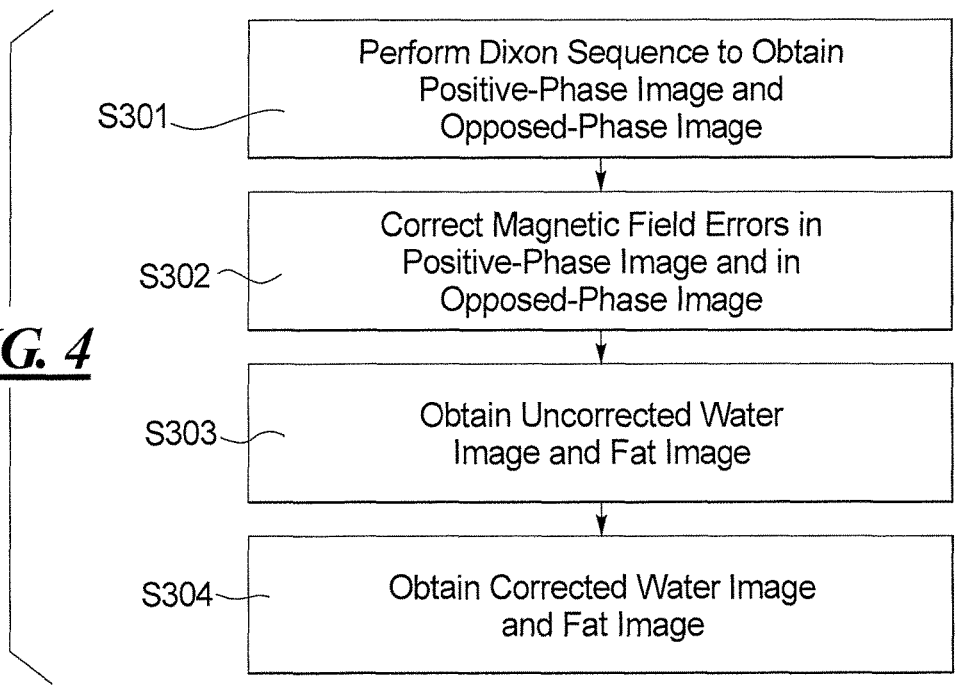
FIG. 4 is a schematic diagram of an MRI method according to a third particular embodiment of the present invention.

FIG. 4 is a schematic diagram of an MRI method according to a third particular embodiment of the present invention. As FIG. 4 shows, the MRI method according to a third particular embodiment of the present invention comprises the following steps:

Step S301: performing a Dixon sequence to obtain a positive-phase image and an opposed-phase image.

Step S302: correcting magnetic field errors in the positive-phase image and the opposed-phase image.

Step S303: using formula [6] to obtain a water image $W_{BDM}$ and a fat image $F_{BDM}$, wherein the water image $W_{BDM}$ and the fat image $F_{BDM}$ are uncorrected.

$$\begin{pmatrix} W_{BDMF} \\ F_{BDMF} \end{pmatrix} = K \begin{pmatrix} W_{BDM} \\ F_{BDM} \end{pmatrix} \qquad [7]$$

wherein K is obtained using formula [8].

$$K = \begin{pmatrix} 1 & 1 \\ 1 & c \end{pmatrix}^{-1} = \begin{pmatrix} 1 & 1 \\ 1 & -1 \end{pmatrix} \qquad [8]$$

wherein formula [3] is used to obtain $$c = \sum_{n=1}^{N} \alpha_n e^{-R_n^* t_{op} + i\Delta f_n t_{op}}.$$

Chemical shift artifacts are artifacts caused by offset in alignment between the water image and fat image. This kind of artifact arises from the fact that the water image and fat image have different resonant frequencies (since the phase of the fat signal will change in the readout stage, phase shift will occur). In the MRI method according to a third particular embodiment of the present invention, artifacts caused by chemical shift can be reduced by using multiple fat peaks in the spectrum of a magnetic resonance image signal to reconstruct a water image and a fat image.

Although modifications and changes may be suggested by those skilled in the art, it is the intention of the inventors to embody within the patent warranted hereon all changes and modifications as reasonably and properly come within the scope of their contribution to the art.

We claim as our invention:

1. A magnetic resonance imaging (MRI) method, comprising the following steps:
   in a computer, generating control signals to operate an MRI apparatus and emitting the control signals to the MRI apparatus in order to perform a scan sequence so as to obtain a positive-phase image and an opposed-phase image of a subject;
   in said computer, correcting magnetic field errors in the positive-phase image and the opposed-phase image; and
   in said computer, analyzing a spectrum of a magnetic resonance image signal from the subject in order to identify multiple fat peaks in the spectrum, generating a mathematical operator from said multiple fat peaks, and applying said mathematical operator to each of the corrected positive-phase image and the corrected opposed-phase image in said computer to reconstruct a water image and a fat image, and displaying the water image and the fat image at a display monitor.

2. The MRI method as claimed in claim 1, operating the MRI apparatus with a multi-echo scan sequence as said scan sequence.

3. The MRI method as claimed in claim 2, comprising selecting said multi-echo scan sequence from the group consisting of a multi-echo TSE sequence, a multi-echo mDixon sequence and a multi-echo vibe Dixon sequence.

4. The MRI method as claimed in claim 2 wherein the step of using the corrected positive-phase image and the corrected opposed-phase image to reconstruct said water image and said fat image based on said multiple fat peaks of the spectrum of a magnetic resonance image signal comprises: using the corrected positive-phase image and the corrected opposed-phase image to reconstruct a water image and a fat image based on multiple fat peaks of the spectrum of a magnetic resonance image signal by applying said mathematical operator to said water image and said fat image according to:

$$\begin{pmatrix} W \\ F \end{pmatrix} = \begin{pmatrix} 1 & 1 \\ 1 & c \end{pmatrix}^{-1} \begin{pmatrix} S_{in} \\ S_{op} \end{pmatrix}$$

wherein $S_{in}$ is the corrected in-phase image, $S_{op}$ is the corrected opposed-phase image, W is the water image, F is the fat image, and c is said mathematical operator, with $$c = \sum_{n=1}^{N} \alpha_n e^{-R_n^* t_{op} + i\Delta f_n t_{op}}$$

wherein $\alpha_n$ is the proportion of the signal intensity of the multiple fat peaks accounted for by each fat peak, $\Delta f_n$ is the frequency shift, $R_n^*$ is the rate of decay, $t_{op}$ is the echo time of the opposed-phase image, and N is the number of the multiple fat peaks.

5. The MRI method as claimed in claim 2, wherein the step of using the corrected positive-phase image and the corrected opposed-phase image to reconstruct a water image and a fat image based on multiple fat peaks of the spectrum of a magnetic resonance image signal comprises:
   performing a Fourier transform on the corrected positive-phase image and the corrected opposed-phase image to obtain k-space data of a positive-phase image and k-space data of an opposed-phase image;
   based on said multiple fat peaks of the spectrum of a magnetic resonance image signal, using the k-space data of the positive-phase image and the k-space data of the opposed-phase image to obtain k-space data of a water image and k-space data of a fat image; and
   performing an inverse Fourier transform on the k-space data of the water image and the k-space data of the fat image to obtain the water image and the fat image.

6. The MRI method as claimed in claim 5 wherein the step of using the k-space data of the positive-phase image and the k-space data of the opposed-phase image to obtain k-space data of a water image and k-space data of a fat image on the basis of multiple fat peaks of the spectrum of a magnetic resonance image signal comprises:
   using the k-space data of the positive-phase image and the k-space data of the opposed-phase image to obtain k-space data of said water image and k-space data of said fat image based on multiple fat peaks of the spectrum of a magnetic resonance image signal by applying said mathematical operator to said water image and said fat image according to:

$$\begin{pmatrix} W_{kspace}(t) \\ F_{kspace}(t) \end{pmatrix} = \begin{pmatrix} 1 & 1 \\ 1 & c(t) \end{pmatrix}^{-1} \begin{pmatrix} KS_{in}(t) \\ KS_{op}(t) \end{pmatrix}$$

wherein $KS_{in}(t)$ is the k-space data of the positive-phase image, $KS_{op}(t)$ is the k-space data of the opposed-phase image, $W_{KSPACE}(t)$ is the k-space data of the water image and $F_{KSPACE}(t)$ is the k-space data of the fat image, and c(t) is said mathematical operator, with, $$c(t) = \sum_{n=1}^{N} \alpha_n e^{-R_n^* t_{op} + i\Delta f_n t_{op}}$$

wherein $\alpha_n$ is the proportion of the signal intensity of the multiple fat peaks accounted for by each fat peak, $\Delta f_n$ is the frequency shift, $R^*_n$ is the rate of decay, $t_{op}$ is the echo time of the opposed-phase image, and N is the number of the multiple fat peaks.

7. The MRI method as claimed in claim 1, comprising using a basic Dixon sequence as said scan sequence.

8. The MRI method as claimed in claim 7, wherein the step of using the corrected positive-phase image and the corrected opposed-phase image to reconstruct a water image and a fat image on based on multiple fat peaks of the spectrum of a magnetic resonance image signal comprises:
in said computer, obtaining an uncorrected water image and an uncorrected fat image according to:

$$\begin{pmatrix} W_{BDM} \\ F_{BDM} \end{pmatrix} = \begin{pmatrix} 0.5 & 0.5 \\ 0.5 & -0.5 \end{pmatrix} \begin{pmatrix} S_{in} \\ S_{op} \end{pmatrix}$$

wherein $S_{in}$ is the corrected in-phase image, $S_{op}$ is the corrected opposed-phase image $W_{BDM}$ is the uncorrected water image and $F_{BDM}$ is the uncorrected fat image; and
obtaining said water image as a final water image and obtaining said fat image as a final fat image according to:

$$\begin{pmatrix} W_{BDMF} \\ F_{BDMF} \end{pmatrix} = K \begin{pmatrix} W_{BDM} \\ F_{BDM} \end{pmatrix}$$

wherein $W_{WBDMF}$ is the final water image and $F_{BDMF}$ is the final fat image, $$K = \begin{pmatrix} 1 & 1 \\ 1 & c \end{pmatrix}^{-1} = \begin{pmatrix} 1 & 1 \\ 1 & -1 \end{pmatrix}$$

wherein c is said mathematical operator, with $$c = \sum_{n=1}^{N} \alpha_n e^{-R_n^* t_{op} + i\Delta f_n t_{op}}$$

wherein $\alpha_n$ is the proportion of the signal intensity of the multiple fat peaks accounted for by each fat peak, $\Delta f_n$ is the frequency shift, $R^*_n$ is the rate of decay, $t_{op}$ is the echo time of the opposed-phase image, and N is the number of the multiple fat peaks.

9. A magnetic resonance imaging (MRI) apparatus comprising:
an MR scanner;
a computer configured to generate control signals to operate said MRI scanner and to emit the control signals to the MR scanner in order to perform a scan sequence so as to obtain a positive-phase image and an opposed-phase image of a subject;
said computer being configured to correct magnetic field errors in the positive-phase image and the opposed-phase image;
a display monitor; and
said computer being configured to analyze a spectrum of a magnetic resonance image signal from the subject in order to identify multiple fat peaks in the spectrum, and to generate a mathematical operator from said multiple fat peaks, and to apply said mathematical operator to each of the corrected positive-phase image and the corrected opposed-phase image in said computer so as to reconstruct a water image and a fat image, and to display the water image and the fat image at said display monitor.

10. The MRI apparatus as claimed in claim 9, wherein said computer is configured to operate said MR scanner so as to perform a multi-echo scan sequence as said scan sequence.

11. The MRI apparatus as claimed in claim 10, wherein the multi-echo scan sequence is selected from the group consisting of a multi-echo TSE sequence, a multi-echo mDixon sequence and a multi-echo vibe Dixon sequence.

12. The MRI apparatus as claimed in claim 10, wherein the computer is configured to use the corrected positive-phase image and the corrected opposed-phase image to reconstruct said water image and said fat image based on said multiple fat peaks of the spectrum of a magnetic resonance image signal by applying said mathematical operator to said water image and said fat image according to:

$$\begin{pmatrix} W \\ F \end{pmatrix} = \begin{pmatrix} 1 & 1 \\ 1 & c \end{pmatrix}^{-1} \begin{pmatrix} S_{in} \\ S_{op} \end{pmatrix}$$

wherein $S_{in}$ is the corrected in-phase image, $S_{op}$ is the corrected opposed-phase image, W is the water image and F is the fat image, and c is said mathematical operator, with $$c = \sum_{n=1}^{N} \alpha_n e^{-R_n^* t_{op} + i\Delta f_n t_{op}}$$

wherein $\alpha_n$ is the proportion of the signal intensity of the multiple fat peaks accounted for by each fat peak, $\Delta f_n$ is the frequency shift, $R^*_n$ is the rate of decay, $t_{op}$ is the echo time of the opposed-phase image, and N is the number of the multiple fat peaks.

13. The MRI apparatus as claimed in claim 10, wherein the reconstruction module is configured to reconstruct said water image and said fat image by:
performing a Fourier transform on the corrected positive-phase image and the corrected opposed-phase image to obtain k-space data of a positive-phase image and k-space data of an opposed-phase image;
based on said multiple fat peaks of the spectrum of a magnetic resonance image signal, using the k-space data of the positive-phase image and the k-space data of the opposed-phase image to obtain k-space data of a water image and k-space data of a fat image; and perform an inverse Fourier transform on the k-space data of the water image and the k-space data of the fat image to obtain the water image and the fat image.

14. The MRI apparatus as claimed in claim 13, wherein the computer is configured to use the k-space data of the positive-phase image and the k-space data of the opposed-phase image to obtain k-space data of a water image and k-space data of a fat image based on said multiple fat peaks of the spectrum of a magnetic resonance image signal by applying said mathematical operator to said water image and said fat image according to:

$$\begin{pmatrix} W_{kspace}(t) \\ F_{kspace}(t) \end{pmatrix} = \begin{pmatrix} 1 & 1 \\ 1 & c(t) \end{pmatrix}^{-1} \begin{pmatrix} KS_{in}(t) \\ KS_{op}(t) \end{pmatrix}$$

wherein $KS_{in}(t)$ is the k-space data of the positive-phase image, $KS_{op}(t)$ is the k-space data of the opposed-phase image, $W_{KSPACE}(t)$ is the k-space data of the water image, $F_{KSPACE}(t)$ is the k-space data of the fat image, and $c(t)$ is said mathematical operator, with $$c(t) = \sum_{n=1}^{N} \alpha_n e^{-R_n^* t_{op} + i\Delta f_n t_{op}}$$

wherein $\alpha_n$ is the proportion of the signal intensity of the multiple fat peaks accounted for by each fat peak, $\Delta f_n$ is the frequency shift, $R^*_n$ is the rate of decay, $t_{op}$ is the echo time of the opposed-phase image, and N is the number of the multiple fat peaks.

15. The MRI apparatus as claimed in claim 9, wherein said computer is configured to operate said MR scanner so as to perform a basic Dixon sequence as said scan sequence.

16. The MRI apparatus as claimed in claim 15, wherein the computer is configured to obtain an uncorrected water image and an uncorrected fat image, according to:

$$\begin{pmatrix} W_{BDM} \\ F_{BDM} \end{pmatrix} = \begin{pmatrix} 0.5 & 0.5 \\ 0.5 & -0.5 \end{pmatrix} \begin{pmatrix} S_{in} \\ S_{op} \end{pmatrix}$$

wherein $S_{in}$ is the corrected in-phase image, $S_{op}$ is the corrected opposed-phase image $W_{BDM}$ is the uncorrected water image, $F_{BDM}$ is the uncorrected fat image; and
using a sixth general formula to correct the uncorrected water image and the uncorrected to obtain said water images as a final water image and to obtain said fat image as a final fat image,
according to:

$$\begin{pmatrix} W_{BDMF} \\ F_{BDMF} \end{pmatrix} = K \begin{pmatrix} W_{BDM} \\ F_{BDM} \end{pmatrix}$$

wherein $W_{WBDMF}$ is the final water image and $F_{FBDMF}$ is the final fat image, $$K = \begin{pmatrix} 1 & 1 \\ 1 & c \end{pmatrix}^{-1} = \begin{pmatrix} 1 & 1 \\ 1 & -1 \end{pmatrix}$$

wherein c is said mathematical operator, with $$c = \sum_{n=1}^{N} \alpha_n e^{-R_n^* t_{op} + i\Delta f_n t_{op}}$$

wherein $\alpha_n$ is the proportion of the signal intensity of the multiple fat peaks accounted for by each fat peak, $\Delta f_n$ is the frequency shift, $R^*_n$ is the rate of decay, $t_{op}$ is the echo time of the opposed-phase image, and N is the number of the multiple fat peaks.

* * * * *